US012765090B2

(12) United States Patent
Jang

(10) Patent No.: US 12,765,090 B2
(45) Date of Patent: Oct. 13, 2026

(54) IMAGE SENSING DEVICE

(71) Applicant: SK hynix Inc., Icheon-si (KR)

(72) Inventor: Jae Hyung Jang, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 550 days.

(21) Appl. No.: 18/356,973

(22) Filed: Jul. 21, 2023

(65) Prior Publication Data

US 2024/0282786 A1 Aug. 22, 2024

(30) Foreign Application Priority Data

Feb. 22, 2023 (KR) ........................ 10-2023-0023497

(51) Int. Cl.
*H10F 39/00* (2025.01)
*H10F 39/18* (2025.01)

(52) U.S. Cl.
CPC ......... *H10F 39/8037* (2025.01); *H10F 39/18* (2025.01); *H10F 39/8023* (2025.01); *H10F 39/803* (2025.01); *H10F 39/8063* (2025.01); *H10F 39/807* (2025.01); *H10F 39/813* (2025.01)

(58) Field of Classification Search
CPC .. H10F 39/8037; H10F 39/18; H10F 39/8023; H10F 39/8063; H10F 39/807; H10F 39/813; H10F 39/80
See application file for complete search history.

(56) References Cited

U.S. PATENT DOCUMENTS

| | | | | |
|---|---|---|---|---|
| 9,369,681 | B1 | 6/2016 | Wu et al. | |
| 2013/0070109 | A1* | 3/2013 | Gove | H04N 25/40 348/207.1 |
| 2018/0081099 | A1* | 3/2018 | Toda | H10F 77/00 |
| 2018/0213142 | A1* | 7/2018 | Usui | H04N 25/704 |
| 2020/0358989 | A1* | 11/2020 | Hoshino | H04N 25/42 |
| 2020/0373339 | A1* | 11/2020 | Lee | H10F 39/8023 |
| 2021/0120199 | A1* | 4/2021 | Kim | H04N 25/766 |
| 2021/0151485 | A1* | 5/2021 | Ma | H04N 25/778 |
| 2022/0068983 | A1* | 3/2022 | Yamazaki | G01B 11/22 |
| 2024/0313011 | A1* | 9/2024 | Lu | H10F 39/8063 |

FOREIGN PATENT DOCUMENTS

| | | | |
|---|---|---|---|
| KR | 20120123849 | A | 11/2012 |
| KR | 20190084446 | A | 7/2019 |

* cited by examiner

*Primary Examiner* — Eliseo Ramos Feliciano
*Assistant Examiner* — Brad A Knudson
(74) *Attorney, Agent, or Firm* — Ashurst Perkins Coie US LLP

(57) ABSTRACT

Disclosed is an image sensing device, including: a plurality of pixel arrays, and the pixel arrays include: a first pixel array including a plurality of first unit pixels, and a second pixel array disposed to surround the first pixel array and including a plurality of second unit pixels, and the first unit pixel includes a plurality of photodiodes, and each photodiode of the first unit pixel is connected to a different transfer transistor.

16 Claims, 19 Drawing Sheets

IMAGE SENSING DEVICE

PRIORITY CLAIM AND CROSS REFERENCE TO RELATED APPLICATION

This patent document claims the priority and benefits of Korean Patent Application No. 10-2023-0023497, filed on Feb. 22, 2023, which is incorporated by reference in its entirety as part of the disclosure of this patent document.

TECHNICAL FIELD

Various embodiments of the disclosed technology relate to an image sensing device, and relate to an image sensing device selectively using pixels.

BACKGROUND

An image sensing device is a device for capturing optical images by converting light into electrical signals using a photosensitive semiconductor material which reacts to light. With the development of automotive, medical, computer and communication industries, the demand for high-performance image sensing devices is increasing in various fields such as smart phones, digital cameras, game machines, IoT (Internet of Things), robots, security cameras and medical micro cameras.

The most common types of image sensing devices are charge coupled device (CCD) image sensors and complementary metal oxide semiconductor (CMOS) image sensors (CISs).

SUMMARY

The disclosed technology can be implemented in some embodiments to provide an image sensing device capable of reducing memory usage and power consumption by selectively using a resolution according to circumstances.

In an embodiment, an image sensing device includes a plurality of pixel arrays, and the pixel arrays may include: a first pixel array including a plurality of first unit pixels, and a second pixel array disposed to surround the first pixel array and including a plurality of second unit pixels, and the first unit pixel may include a plurality of photodiodes, and each photodiode of the first unit pixel may be connected to a different transfer transistor.

The second unit pixel may include a plurality of photodiodes, and each photodiode of the second unit pixel may be connected to a first transfer transistor.

The first unit pixel may include a first photodiode, a second photodiode, a third photodiode, and a fourth photodiode, and the first photodiode may be connected to a first transfer transistor, the second photodiode may be connected to a second transfer transistor, the third photodiode may be connected to a third transfer transistor, and the fourth photodiode may be connected to a fourth transfer transistor.

The image sensing device may further include: a timing controller configured to control operations of the first transfer transistor, the second transfer transistor, the third transfer transistor, and the fourth transfer transistor, and the first unit pixel may include a first select transistor, and the second unit pixel may include a second select transistor, and in a full mode, the timing controller may activate the first transfer transistor, the second transfer transistor, the third transfer transistor, and the fourth transfer transistor and turn on the first select transistor and the second select transistor so that both the first unit pixel and the second unit pixel are in an activated state.

The first unit pixel may include a first reset transistor, and the second unit pixel may include a second reset transistor, and the timing controller may activate the first reset transistor so that the second unit pixel is in a deactivated state, when an object is detected while both the first unit pixel and the second unit pixel are in an activated state, and the timing controller may sequentially turn on the second transfer transistor, the third transfer transistor, and the fourth transfer transistor, and sequentially turn on the second select transistor and the second reset transistor so that the first unit pixel is in an activated state.

The second unit pixel may include a plurality of photodiodes, and each photodiode of the second unit pixel may be connected to a 0th transfer transistor.

The first unit pixel may include a first photodiode, a second photodiode, a third photodiode, and a fourth photodiode, and the first photodiode may be connected to a first transfer transistor, the second photodiode may be connected to a second transfer transistor, the third photodiode may be connected to a third transfer transistor, and the fourth photodiode may be connected to a fourth transfer transistor.

The image sensing device may further include: a timing controller configured to activate the zeroth transfer transistor, the first transfer transistor, the second transfer transistor, the third transfer transistor, and the fourth transfer transistor, and the first unit pixel and the second unit pixel may include a first select transistor, and in a full mode, the timing controller may activate the zeroth transfer transistor, the first transfer transistor, the second transfer transistor, the third transfer transistor, and the fourth transfer transistor and turn on the first select transistor so that both the first unit pixel and the second unit pixel are in an activated state.

The first unit pixel and the second unit pixel may include a first reset transistor, and the timing controller, when an object is detected while both the first unit pixel and the second unit pixel are in an activated state, may maintain the zeroth transfer transistor in a deactivated state so that the second unit pixel is in a deactivated state; sequentially may activate the second transfer transistor, the third transfer transistor, and the fourth transfer transistor and sequentially turn on the first select transistor and the first reset transistor so that the first unit pixel is in an activated state.

The second unit pixel may include a single photodiode, and the single photodiode of the second unit pixel may be connected to a zeroth transfer transistor or a first transfer transistor.

The first unit pixel may include a first photodiode, a second photodiode, a third photodiode, and a fourth photodiode, and the first photodiode may be connected to a first transfer transistor, the second photodiode may be connected to a second transfer transistor, the third photodiode may be connected to a third transfer transistor, and the fourth photodiode may be connected to a fourth transfer transistor.

The first unit pixel or the second unit pixel may include a sawtooth-shaped concavo-convex structure formed on a substrate.

The image sensing device may include: a deep trench isolation layer configured to optically separate the first unit pixel from the second unit pixel, and the deep trench isolation layer may be formed between the first unit pixel and the second unit pixel and between regions including each photodiode of the first unit pixel.

Each of the first unit pixel and the second unit pixel may include a plurality of microlenses formed at a top region of the first unit pixel and the second unit pixel, and a microlens of the first unit pixel may have a same width as a microlens of the second unit pixel.

The first unit pixel may include a plurality of microlenses formed at a top region of the first unit pixel, and the second unit pixel may include a single microlens formed at a top region of the first unit pixel, and a width of the microlens of the second unit pixel may be greater than a width of the microlens of the first unit pixel.

The second pixel array may include: a first peripheral pixel array disposed to surround the first pixel array and including a plurality of second unit pixels; and a second peripheral pixel array disposed to surround the first peripheral pixel array and including a plurality of third unit pixels.

The second unit pixel may include a plurality of photodiodes or a single photodiode, and the third unit pixel may include a plurality of photodiodes or a single photodiode.

In another embodiment, an image sensing device includes a plurality of pixel arrays, and the pixel arrays may include: a first pixel array formed in a central region and a corner region and including a plurality of first unit pixels, and a second pixel array formed in a region other than the central region and the corner region and including a plurality of second unit pixels, the first unit pixel may include a plurality of photodiodes, and an area of the first pixel array is smaller than an area of the second pixel array.

The second unit pixel may include a plurality of photodiodes or a single photodiode.

In another embodiment, an image sensing device includes a plurality of pixel arrays, and the pixel arrays may include: a first pixel array formed in a region other than a central region and a corner region and including a plurality of first unit pixels, and a second pixel array formed in the central region and the corner region and including a plurality of second unit pixels, the first unit pixel may include a plurality of photodiodes, and an area of the first pixel array is smaller than an area of the second pixel array.

The second unit pixel may include a plurality of photodiodes or a single photodiode.

In another embodiment, an image sensing device includes a first pixel array comprising a plurality of first unit pixels arranged in the first pixel array and configured to detect incident light and generate electrical signals corresponding to the incident light, and a second pixel array comprising a plurality of second unit pixels disposed to surround the first pixel array and configured to detect incident light and generate electrical signals corresponding to the incident light, wherein each first unit pixel comprises a plurality of photodiodes, and each photodiode of the first unit pixel is coupled to a transfer transistor for transferring electrical charge produced by each photodiode in response to incident light out of the photodiode for readout, wherein different photodiodes in the first unit pixel are coupled to different transfer transistors, respectively, and the different transfer transistors are configured to be turned on in response to different transfer transistor control signals, respectively.

In another embodiment, an image sensing device includes a first pixel array formed in a central region and a corner region and comprising a plurality of first unit pixels, and a second pixel array formed in a region other than the central region and the corner region and comprising a plurality of second unit pixels, wherein the first unit pixel comprises a plurality of photodiodes, wherein an area of the first pixel array is smaller than an area of the second pixel array.

In another embodiment, an image sensing device includes a first pixel array formed in a region other than a central region and a corner region and comprising a plurality of first unit pixels, and a second pixel array formed in the central region and the corner region and comprising a plurality of second unit pixels, wherein the first unit pixel comprises a plurality of photodiodes, wherein an area of the first pixel array is smaller than an area of the second pixel array.

Memory usage and power consumption may be reduced by selectively using a resolution according to circumstances.

When a new object is detected, memory usage and power consumption may be reduced by moving a camera to or focusing the camera on the object, and then operating only a first unit pixel 1110 of the first pixel array randomly selected.

By forming a sawtooth-shaped (or triangular) concavo-convex structure 10 on a substrate of the first unit pixel 1110 or a second unit pixel 1120, scattering of the irradiated light source occurs and an incident distance becomes longer and the staying time in the substrate (Si) increases, thereby quantum efficiency (QE) is increased.

DETAILED DESCRIPTION

Features, and certain advantages in connection with specific implementations of the disclosed technology disclosed in this patent document are described by example embodiments with reference to the accompanying drawings.

Figure 1:
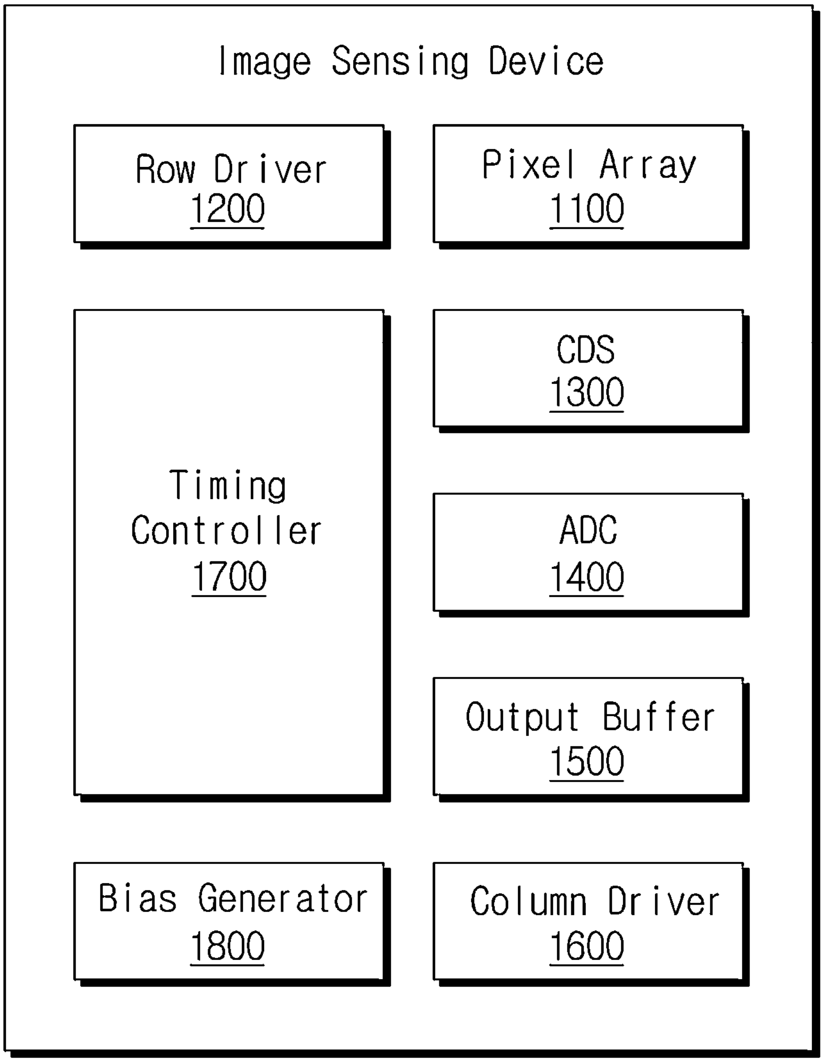
FIG. 1 is a block diagram illustrating an image sensing device based on an embodiment of the disclosed technology.

FIG. 1 is a block diagram illustrating an image sensing device based on an embodiment of the disclosed technology.

Referring to FIG. 1, an image sensing device based on an embodiment of the disclosed technology includes, by way of example only, a pixel array 1100, a row driver 1200, a correlated double sampler (CDS) 1300, and an analog-to-digital converter (ADC) 1400, an output buffer 1500, a column driver 1600, a timing controller 1700, and a bias generator 1800. In some implementations, some of the constituent elements discussed above may be omitted, or an additional constituent element may be added.

The pixel array 1100 may include a plurality of rows and a plurality of columns, and a plurality of pixels may be arranged in the pixel array 1100. In one example, the plurality of pixels can be arranged in rows and columns in a two-dimensional pixel array. In another example, the plurality of pixels can be arranged in a three-dimensional pixel array. The plurality of pixels may convert an optical signal into an electrical signal on a unit pixel basis or a pixel group basis, where pixels in a pixel group share at least certain internal circuitry. The pixel array 1100 may receive driving signals, including a row selection signal, a pixel reset signal and a transmission signal, from the row driver 1200. Upon receiving the driving signal, corresponding pixels in the pixel array 1100 may be activated to perform the operations corresponding to the row selection signal, the pixel reset signal, and the transmission signal.

The row driver 1200 may activate the pixel array 1100 to perform certain operations on the pixels in the corresponding row based on commands and control signals provided by the timing controller 1700. In an embodiment, the row driver 1200 may select one or more pixels arranged in one or more rows of the pixel array 1100. The row driver 1200 may generate a row selection signal to select one or more rows of the plurality of rows. The row driver 1200 may sequentially enable the transmission signal and the pixel reset signal for resetting pixels corresponding to at least one selected row. Thus, an analog reference signal and an analog image signal generated by each of the imaging pixels of the selected row may be sequentially transferred to the CDS 1300. Here, the reference signal may be an electrical signal that is provided to the CDS 1300 when a sensing node of a pixel (e.g., floating diffusion node) is reset, and the image signal may be an electrical signal that is provided to the CDS 1300 when photocharges generated by the pixel are accumulated in the sensing node. The reference signal representing reset noise inherent in the pixel and the image signal representing the intensity of incident light may be collectively referred to as a pixel signal.

CMOS image sensors may use the correlated double sampling (CDS) to remove undesired offset values of pixels known as the fixed pattern noise by sampling a pixel signal twice to remove the difference between these two samples. In one example, the correlated double sampling (CDS) may remove the undesired offset value of pixels by comparing pixel output voltages obtained before and after photocharges generated by incident light are accumulated in the sensing node so that only pixel output voltages based on the incident light can be measured. In some embodiments, the CDS 1300 may sequentially sample and hold voltage levels of the reference signal and the image signal, which are provided to each of a plurality of column lines from the pixel array 1100. That is, the CDS 1300 may sample and hold the voltage levels of the reference signal and the image signal which correspond to each of the columns of the pixel array 1100.

The CDS 1300 may transfer the reference signal and the image signal of each of the columns as a correlate double sampling signal to the ADC 1400 based on control signals from the timing controller 1700.

The ADC 1400 may convert analog CDS signals of each of the columns output from the CDS 1300 into digital signals and output the digital signals. In some embodiments, the ADC 1400 may be implemented as a ramp-compare type ADC. The ramp-compare type ADC may include a comparator circuit for comparing the analog pixel signal with a reference signal such as a ramp signal that ramps up or down, and a timer counts until a voltage of the ramp signal matches the analog pixel signal. In some embodiments, the ADC 1400 may convert the correlate double sampling signal generated by the CDS 1300 for each of the columns into a digital signal, and output the digital signal.

The ADC 1400 may include a plurality of column counters corresponding to each of the columns of the pixel array 1100. Each column of the pixel array 1100 is coupled to a column counter, and image data can be generated by converting the correlate double sampling signals received from each column into digital signals using the column counter. In another embodiment, the ADC 1400 may include a global counter to convert the correlate double sampling signals corresponding to the columns into digital signals using a global code provided from the global counter.

The output buffer 1500 may temporarily hold the column-based image data provided from the ADC 1400 to output the image data. The output buffer 1500 may temporarily store the image data from the ADC 1400 based on control signals of the timing controller 1700. The output buffer 1500 may operate as an interface that compensates for a difference in transmission (or processing) speed between the image sensing device and other connected devices.

The column driver 1600 may select a column of the output buffer upon receiving a control signal from the timing controller 1700, and sequentially output the image data, which are temporarily stored in the selected column of the output buffer 1500. In an embodiment, upon receiving an address signal from the timing controller 1700, the column driver 1600 may generate a column selection signal based on the address signal and select a column of the output buffer 1500, outputting the image data as an output signal from the selected column of the output buffer 1500.

The timing controller 1700 may control at least one among the row driver 1200, the CDS 1300, the ADC 1400, the output buffer 1500, the column driver 1600, and the bias generator 1800.

The timing controller 1700 may provide at least one among the row driver 1200, the CDS 1300, the ADC 1400, the output buffer 1500, the column driver 1600 and the bias generator 1800 with a clock signal required for the operations of the respective components of the image sensing device, a control signal for timing control, address signals for selecting a row or column, and a signal that controls a level of a bias voltage applied to the pixel array 1100. In an embodiment of the disclosed technology, the timing controller 1700 may include a logic control circuit, a phase lock loop (PLL) circuit, a timing control circuit, and a communication interface circuit, and the like.

The bias generator 1800 may generate a bias voltage for suppressing dark current generated in pixels of the pixel array 1100 and may provide the generated bias voltage to the pixel array 1100.

The bias voltage may be decided in a wafer probe test process and stored in a one-time programmable (OTP) memory. For example, the bias voltage may be experimentally determined as a value capable of maximizing a dark current suppression effect while minimizing unnecessary power consumption without impairing performance of the image sensing device.

The bias generator 1800 may generate a voltage corresponding to the bias voltage value stored in an OTP memory. In an embodiment of the disclosed technology, the OTP memory may be included in the image sensing device. In one example, the OTP memory may be included in the bias generator 1800.

In an embodiment of the disclosed technology, the bias voltage may include a plurality of values.

In one example, the plurality of values of the bias voltage may respectively correspond to a plurality of operation modes of the image sensing device. A dark current generated at low-intensity light and a dark current generated at high-intensity light may be different from each other, and a bias voltage, which is provided by the bias generator 1800 to effectively suppress dark current in each environment, may vary depending on the operation mode of the image sensing device.

In another example, the plurality of values of the bias voltage may respectively correspond to a plurality of regions of the pixel array 1100. The dark current may vary depending on the position of the corresponding pixel on the pixel array 1100, and the bias voltage, which is provided by the bias generator 1800 to effectively suppress the dark current regardless of a position of the pixel, may vary depending on the region of the pixel array 1100.

The bias voltage may be a may be a negative (−) voltage, but disclosed technology is not limited thereto.

When image sensing devices, such as image sensing devices in security cameras, keep running, memory usage and power consumption increase because it must be operated continuously and for a long time.

Figure 2:
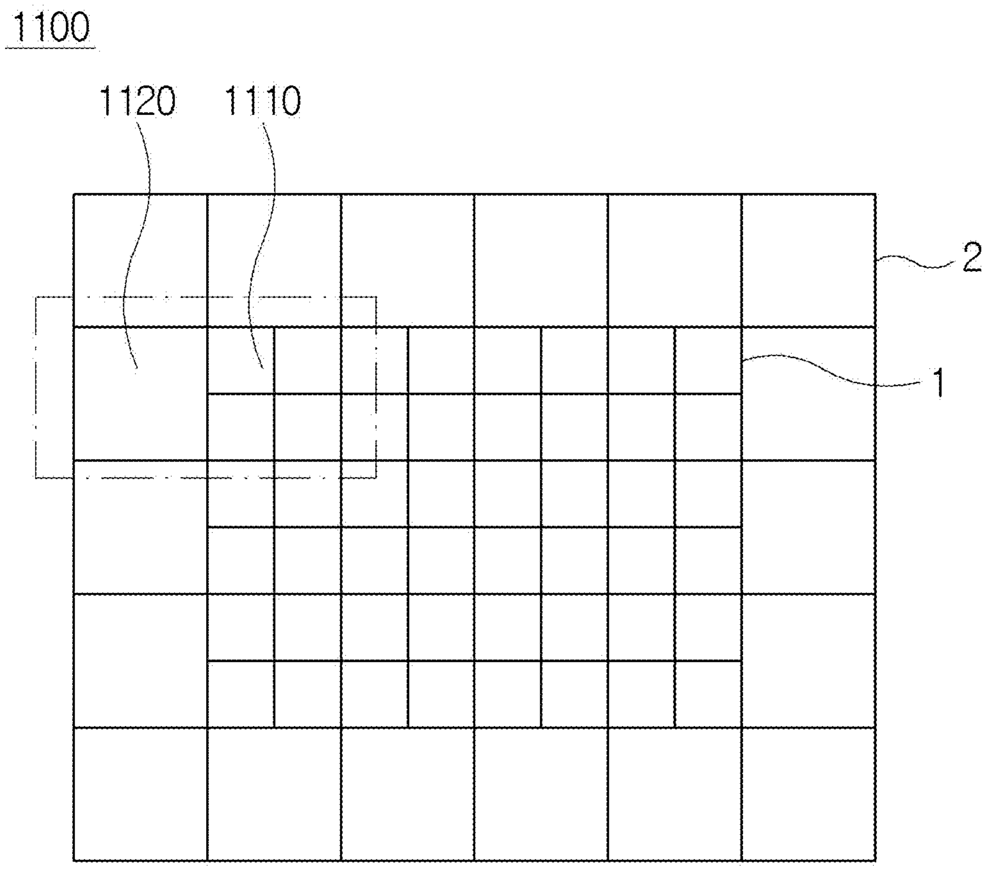
FIG. 2 shows an example of a pixel array 1100 based on an embodiment of the disclosed technology.

FIG. 2 shows an example of a pixel array 1100 based on an embodiment of the disclosed technology.

Referring to FIG. 2, the pixel array 1100 based on an embodiment of the disclosed technology includes a first pixel array 1 and a second pixel array 2. In some implementations, the first pixel array 1 may be referred to as a first pixel array 1 and the second pixel array 2 may be referred to as a second pixel array. In some implementations, the first pixel array 1 may be referred to as a central pixel array 1 and the second pixel array 2 may be referred to as a peripheral pixel array.

As an example, the central pixel array 1 is a pixel region disposed in a central region of the pixel array 1100 and may include a plurality of first unit pixels 1110.

As an example, the peripheral pixel array 2 is a pixel region disposed to surround the central pixel array 1 and may include a plurality of second unit pixels 1120. In some implementations, the area of the central pixel array 1 may be smaller than the area of the peripheral pixel array 2.

When an object is detected based on a control signal of the timing controller 1700, by moving the camera to or focusing the camera on the object, and then operating only the first unit pixel 1110 of the central pixel array 1 randomly selected, memory usage and power consumption can be reduced.

Figure 3:
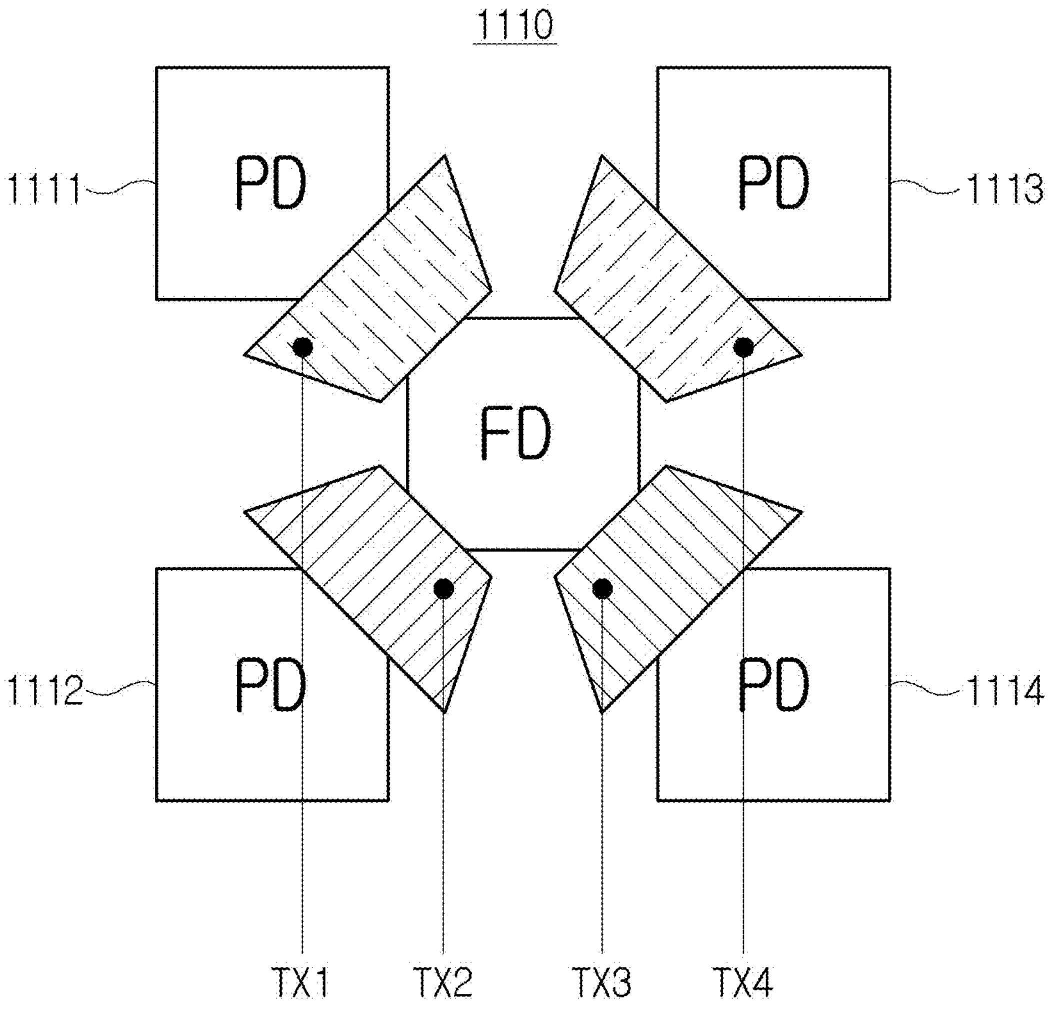
FIG. 3 shows an example of a pixel array 1100 based on an embodiment of the disclosed technology.
Figure 4:
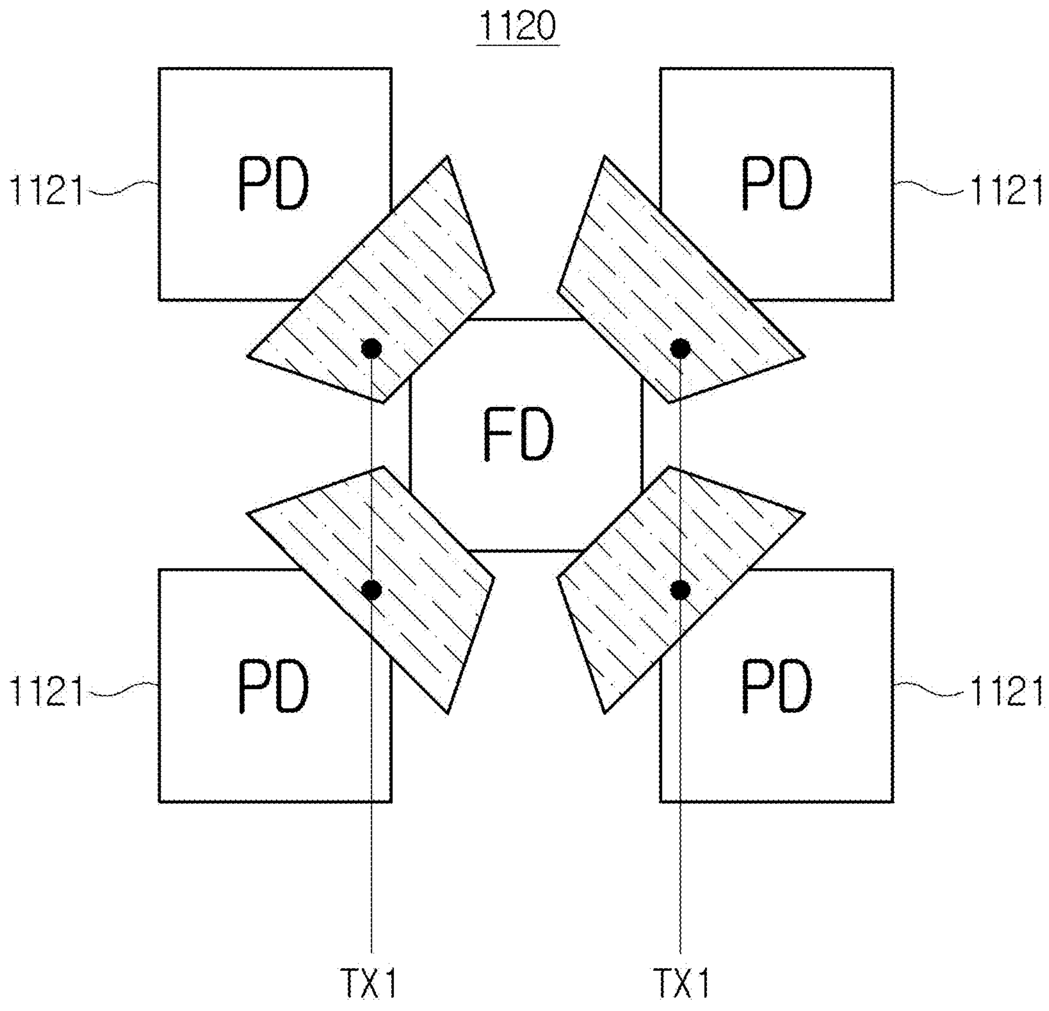
FIG. 4 shows another example of a pixel array 1100 based on an embodiment of the disclosed technology.

FIGS. 3 and 4 show examples of a pixel array 1100 based on an embodiment of the disclosed technology.

Referring to FIG. 3, the first unit pixel 1110 includes different photodiodes PDs (such as four PDs 1111, 1112, 1113 and 114) that convert received light into photocharge. A common floating diffusion region FD is formed between the different photodiodes PDs (e.g., at the center of the different photodiodes PDs) to collect the photocharge from the different photodiodes PDs and a unit pixel readout circuit is coupled to the common floating diffusion region FD to readout the stored photocharge therein as a unit pixel electrical signal representing the incident light received and detected by the unit pixel. Between the different photodiodes 1111, 1112, 1113, 1114 and the common floating diffusion region FD, different transfer transistors TX1, TX2, TX3, TX4 are respectively placed to electrically connect the different photodiodes 1111, 1112, 1113, 1114 to the common floating diffusion region FD, respectively. In some implementations, the transfer transistors TX1, TX2, TX3, TX4 are turned on in response to different transfer transistor control signals, respectively. In some implementations, the transfer transistors TX1, TX2, TX3, TX4 may be switching devices other than transistors. As further explained below, the readout is carried out by a readout circuit in each unit pixel that includes a reset transistor coupled to the floating diffusion region FD to reset to reset the FD after each readout operation and a select transistor for select and activate a unit pixel to readout in connection with different phases of a pixel operation cycle: (1) photo exposure in a photodiode, (2) transfer of photocharge from a photodiode to FD, (3) readout of the charge stored in FD, and (4) resetting the FD (and to get ready for the next pixel operation cycle).

In an example configuration where the first unit pixel 1110 includes a first photodiode 1111, a second photodiode 1112, a third photodiode 1113, and a fourth photodiode 1114, the first photodiode 1111 may be electrically connected to a first transfer transistor TX1, the second photodiode 1112 may be electrically connected to a second transfer transistor TX2, the third photodiode 1113 may be electrically connected to a third transfer transistor TX3, and the fourth photodiode 1114 may be electrically connected to a fourth transfer transistor TX4.

Each of the first photodiode 1111, the second photodiode 1112, the third photodiode 1113, and the fourth photodiode 1114 may be electrically connected to the floating diffusion region FD.

As an example, the first unit pixel 1110 may include the first transfer transistor TX1, the second transfer transistor TX2, the third transfer transistor TX3, and the fourth transfer transistor TX4.

The first transfer transistor TX1 may transfer photocharges generated by the first photodiode 1111 to the floating diffusion region FD.

The second transfer transistor TX2 may transfer photocharges generated by the second photodiode 1112 to the floating diffusion region FD.

The third transfer transistor TX3 may transfer photocharges generated by the third photodiode 1113 to the floating diffusion region FD.

The fourth transfer transistor TX4 may transfer photocharges generated by the fourth photodiode 1114 to the floating diffusion region FD.

Referring to FIG. 4, the second unit pixel 1120, as an example, includes a plurality of photodiodes PD, and each photodiode PD may be connected to the first transfer transistor TX1.

As an example, the second unit pixel 1120 may include four photodiodes 1121.

Each of the four photodiodes 1121 may be connected to the same first transfer transistor TX1.

Each of the four photodiodes 1121 may be connected to the floating diffusion region FD.

The first transfer transistor TX1 may simultaneously transfer the photocharges generated by the four photodiodes 1121 to the floating diffusion region FD.

Figure 5:
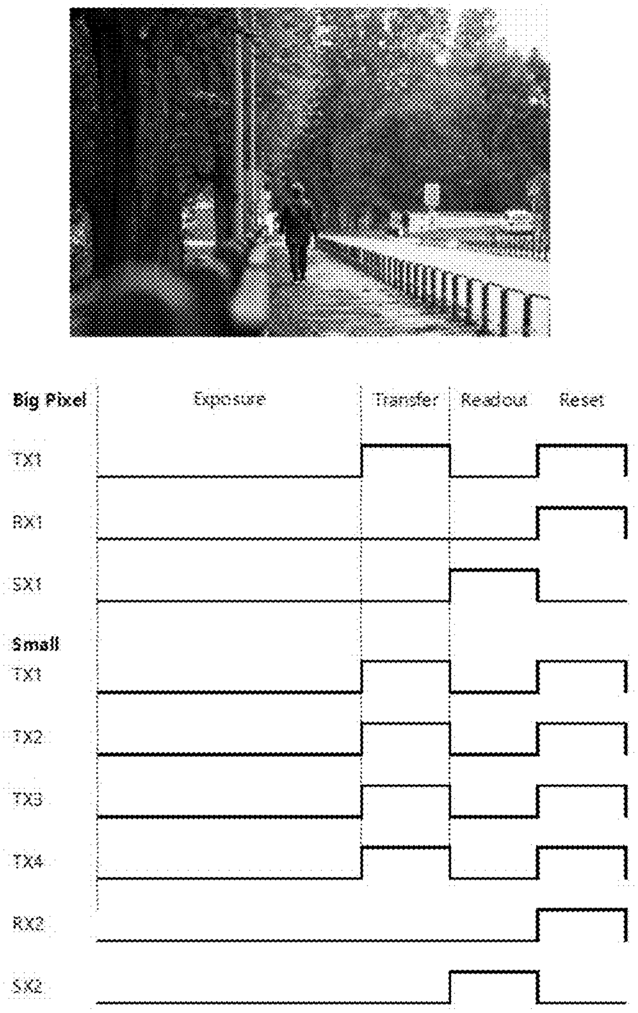
FIG. 5 shows an example of a timing diagram of an image sensing device in a full mode based on embodiment of the disclosed technology.
Figure 6:
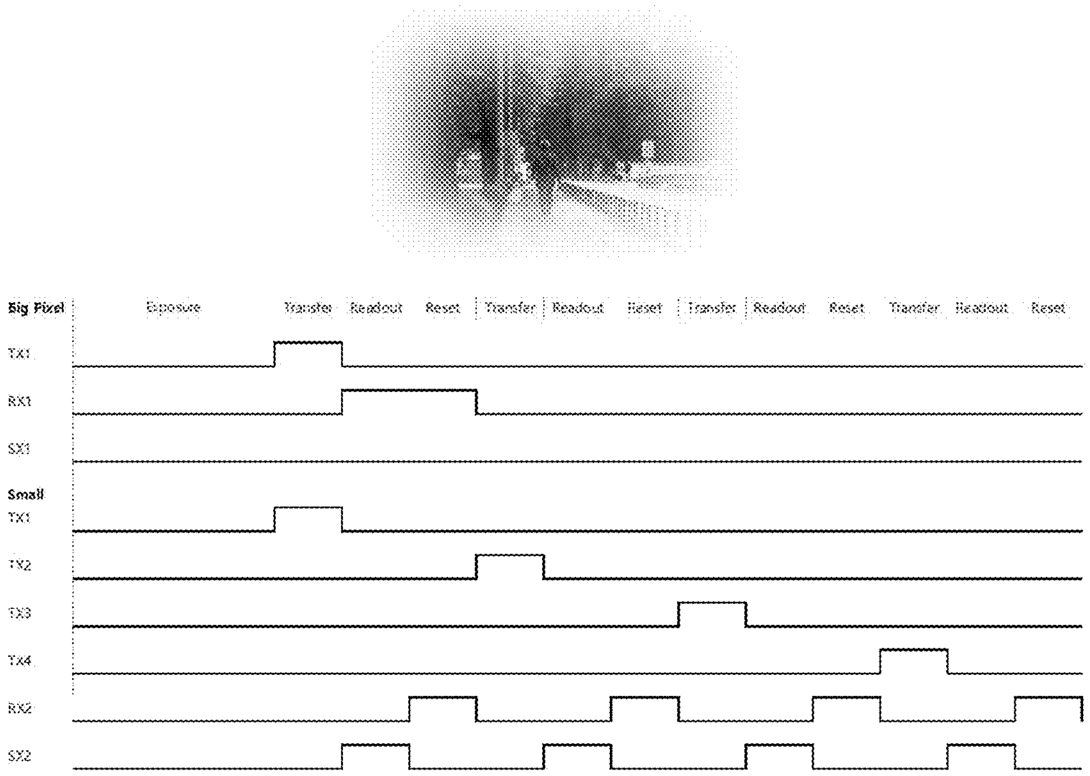
FIG. 6 shows an example of a timing diagram of an image sensing device in a small mode (Small pixel full mode) based on an embodiment.

As an example, the second unit pixel 1120 may include a first reset transistor RX1 (shown in FIG. 5 and FIG. 6) and a first select transistor SX1 (shown in FIG. 5 and FIG. 6).

As an example, the first unit pixel 1110 may include a second reset transistor RX2 (shown in FIGS. 5 and 6) and a second select transistor SX2 (shown in FIGS. 5 and 6).

Each of the first reset transistor RX1 and the second reset transistor RX2 may be electrically connected between a drain voltage and the floating diffusion region FD, and may reset the voltage at the floating diffusion region FD to the drain voltage in response to a reset control signal.

Each of the first select transistor SX1 and the second select transistor SX2 may be used to select pixels to be read on a row basis. Here, the term "row" can be used to indicate a row of an array of pixels arranged in rows and columns in the array.

FIG. 5 shows an example of a timing diagram of the image sensing device in a full mode based on an embodiment of the disclosed technology.

Referring to FIG. 5, in the full mode, the timing controller 1700 may activate the first transfer transistor TX1, the second transfer transistor TX2, the third transfer transistor TX3, and the fourth transfer transistor TX4, and turn on the first select transistor and the second select transistor so that both the first unit pixel 1110 and the second unit pixel 1120 are in an ON state.

In the full mode, the first transfer transistor TX1, the second transfer transistor TX2, the third transfer transistor TX3, and the fourth transfer transistor TX4 are activated based on the control signal of the timing controller 1700, and the first select transistor SX1 and the second select transistor SX2 are activated, and accordingly, both the first unit pixel 1110 and the second unit pixel 1120 are in an ON state. Since all pixels are operated in the full mode, the memory usage and power consumption of the image sensing device can be larger than the memory usage and power consumption of the image sensing device in a small mode (small pixel full mode).

FIG. 6 shows an example of a timing diagram of the image sensing device in a small mode (small pixel full mode) based on an embodiment of the disclosed technology.

Referring to FIG. 6, when an object is detected while both the first unit pixel 1110 and the second unit pixel 1120 are in an ON state, the timing controller 1700 may activate the first reset transistor RX1 so that the second unit pixel 1120 is in an OFF state, and the timing controller may sequentially activate the second transfer transistor TX2, the third transfer transistor TX3, and the fourth transfer transistor TX4 and may sequentially activate the second select transistor SX2 and the second reset transistor RX2 so that the first unit pixel 1110 is in an ON state.

When a processor (not illustrated) analyzes image data in the full mode state (a state in which the first transfer transistor TX1 is activated) and determines that an object (e.g., person) is detected, as the first reset transistor RX1 is activated based on the control signal of the controller 1700, the second unit pixel 1120, which includes pixels larger than the pixels in the first unit pixel 1110, is in an OFF state. As the second transfer transistor TX2, the third transfer transistor TX3, and the fourth transfer transistor TX4 are sequentially activated, and the second select transistor SX2 and the reset transistor RX2 are sequentially activated, the first unit pixel 1110, which includes pixels smaller than the pixels in the second unit pixel 1120, transitions to an ON state. In this way, the pixels capturing an image of an object (e.g., person) are in an ON state and the pixels capturing background images around the object are in an OFF state, and thus the object is focused and the background is blurred, thereby reducing the memory usage and power consumption compared to the full mode.

Figure 7:
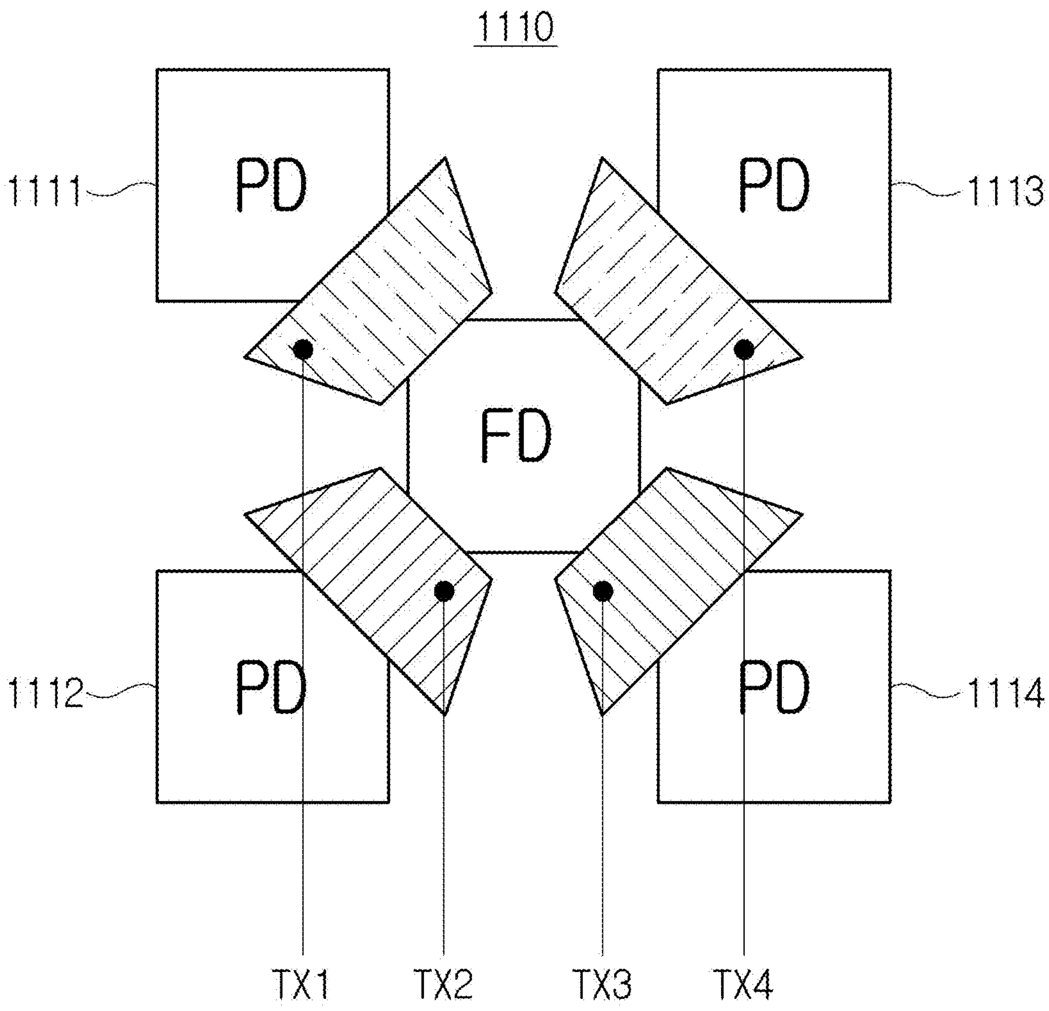
FIG. 7 shows an example of a pixel array 1100 based on an embodiment of the disclosed technology.
Figure 8:
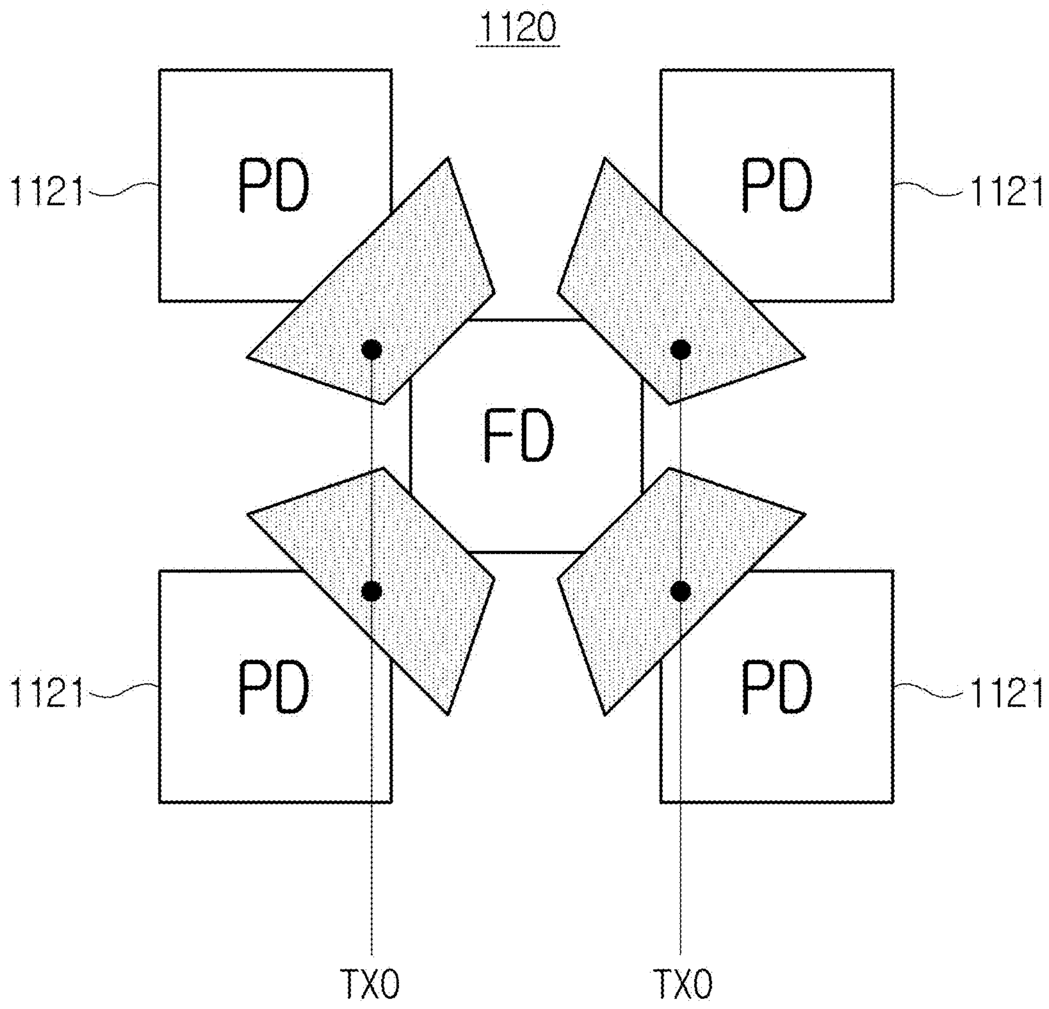
FIG. 8 shows another example of a pixel array 1100 based on an embodiment of the disclosed technology.

FIGS. 7 and 8 show examples of a pixel array 1100 based on some embodiments of the disclosed technology.

Referring to FIG. 7, as an example, the first unit pixel 1110 includes four photodiodes PD, and different photodiodes 1111, 1112, 1113, 1114 may be electrically connected to different transfer transistors TX1, TX2, TX3, TX4, respectively. In some implementations, the transfer transistors TX1, TX2, TX3, TX4 are turned on in response to different transfer transistor control signals, respectively. In some implementations, the transfer transistors TX1, TX2, TX3, TX4 may be switching devices that are not transistors.

In an example configuration where the first unit pixel 1110 includes the first photodiode 1111, the second photodiode 1112, the third photodiode 1113, and the fourth photodiode 1114, the first photodiode 1111 may be electrically connected to the first transfer transistor TX1, the second photodiode 1112 may be electrically connected to the second transfer transistor TX2, the third photodiode 1113 may be electrically connected to the third transfer transistor TX3, and the fourth photodiode 1114 may be electrically connected to the fourth transfer transistor TX4.

Each of the first photodiode 1111, the second photodiode 1112, the third photodiode 1113, and the fourth photodiode 1114 may be electrically connected to the floating diffusion region FD.

As an example, the first unit pixel 1110 may include the first transfer transistor TX1, the second transfer transistor TX2, the third transfer transistor TX3, and the fourth transfer transistor TX4.

The first transfer transistor TX1 may transfer photocharges generated by the first photodiode 1111 to the floating diffusion region FD.

The second transfer transistor TX2 may transfer photocharges generated by the second photodiode 1112 to the floating diffusion region FD.

The third transfer transistor TX3 may transfer photocharges generated by the third photodiode 1113 to the floating diffusion region FD.

The fourth transfer transistor TX4 may transfer photocharges generated by the fourth photodiode 1114 to the floating diffusion region FD.

Referring to FIG. 8, the second unit pixel 1120, as an example, includes a plurality of photodiodes PD, and each photodiode PD may be connected to the 0th transfer transistor TX0.

As an example, the second unit pixel 1120 may include four photodiodes 1121.

Each of the four photodiodes 1121 may be connected to the same 0th transfer transistor TX0.

Each of the four photodiodes 1121 may be connected to the floating diffusion region FD.

The 0th transfer transistor TX0 may simultaneously transfer the photocharges generated by the four photodiodes 1121 to the floating diffusion region FD.

Figure 9:
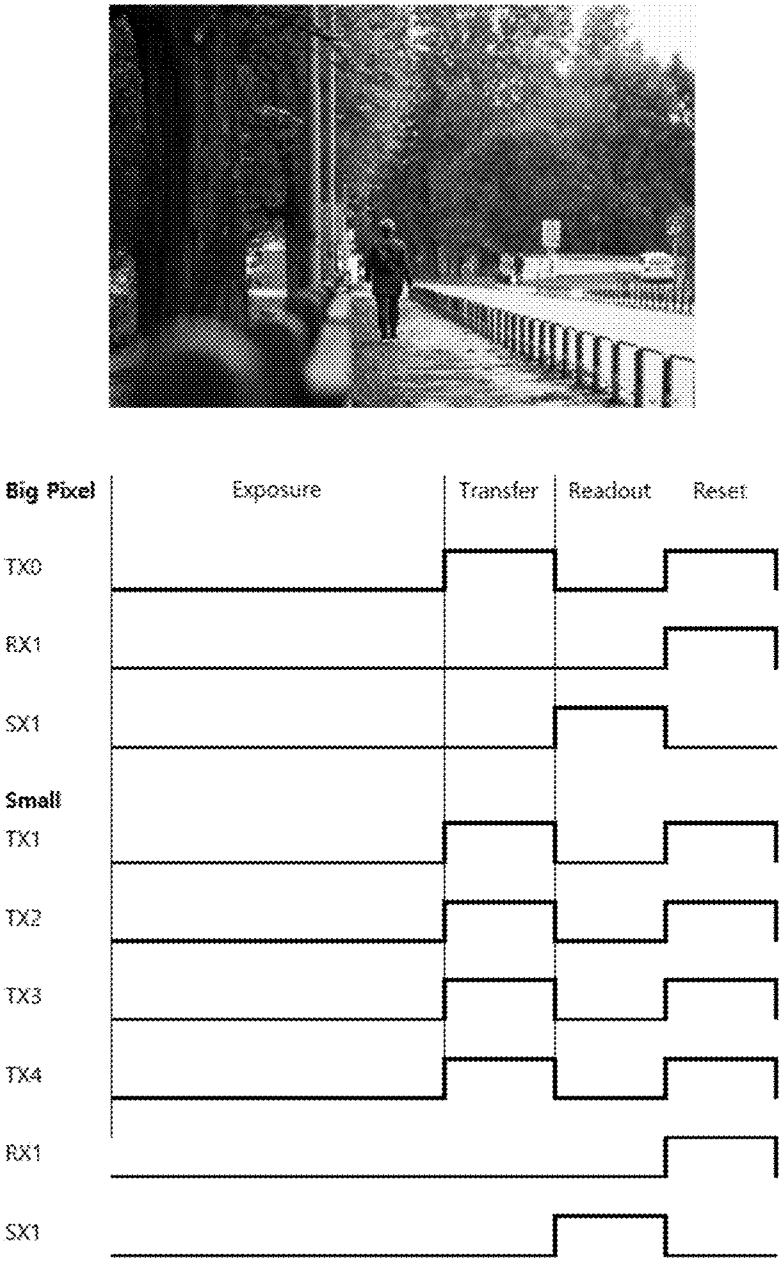
FIG. 9 shows an example of a timing diagram of the image sensing device in a full mode based on an embodiment of the disclosed technology.
Figure 10:
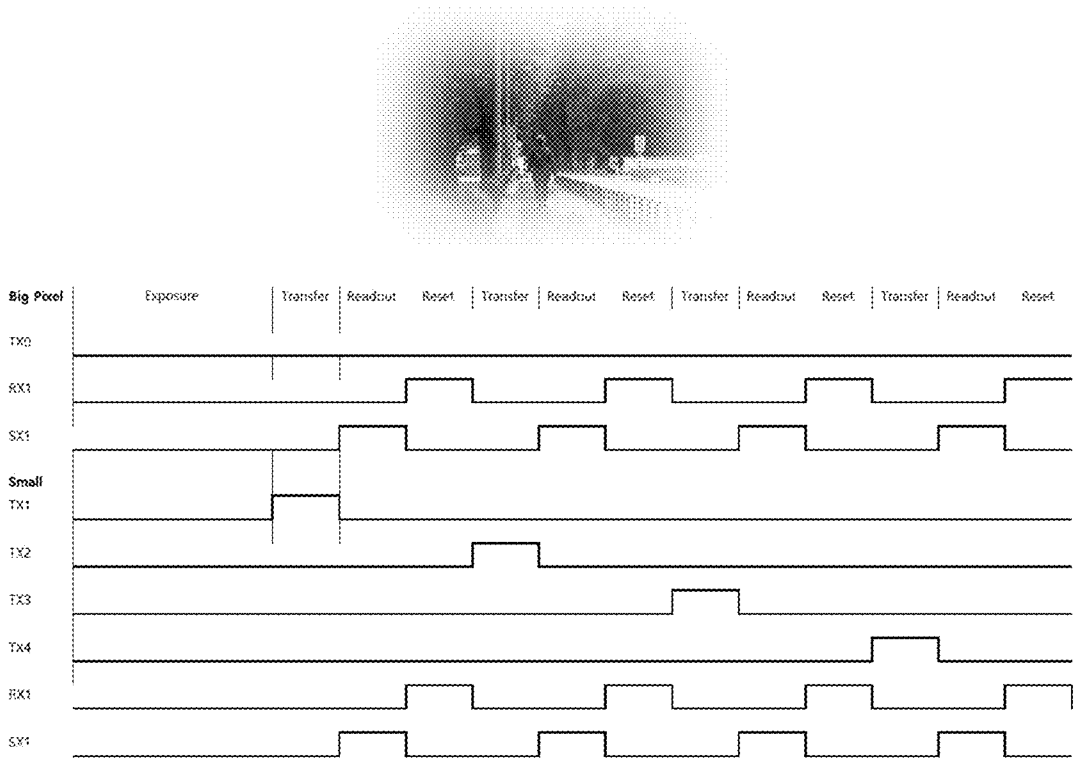
FIG. 10 shows an example of a timing diagram of the image sensing device in a small mode (Small pixel full mode) based on embodiment of the disclosed technology.

As an example, the first unit pixel 1110 and the second unit pixel 1120 may include the first reset transistor RX1 (shown in FIGS. 9 and 10) and the first select transistor SX1 (shown in FIGS. 9 and 10).

The first reset transistor RX1 may be electrically connected between the drain voltage and the floating diffusion region FD, and may reset the voltage at the floating diffusion region FD to the drain voltage in response to a reset control signal.

The first select transistor SX1 may select pixels to be read on a row basis.

Since the first unit pixel 1110 and the second unit pixel 1120 use the first reset transistor RX1 and the first select transistor SX1 as a common line, the pixel array 1100 may have a smaller footprint.

FIG. 9 shows an example of a timing diagram of the image sensing device in the full mode based on an embodiment of the disclosed technology.

Referring to FIG. 9, in the full mode, the timing controller may activate the 0th transfer transistor TX0, the first transfer transistor TX1, the second transfer transistor TX2, the third transfer transistor TX3, and the fourth transfer transistor TX4, and activate the first select transistor SX1 so that both the first unit pixel 1110 and the second unit pixel 1120 are in an ON state.

In the full mode, based on the control signal of the timing controller 1700, as the 0th transfer transistor TX0, the first transfer transistor TX1, the second transfer transistor TX2, the third transfer transistor TX3, and the fourth transfer transistor TX4 are activated, and the first select transistor SX1, which is a common line, is activated, the first unit pixel 1110 and the second unit pixel 1120 are all in an ON state. As all pixels are operated in the full mode, the memory usage and power consumption may increase compared to the small mode.

FIG. 10 shows an example of a timing diagram of the image sensing device in the small mode (Small pixel full mode) based on an embodiment of the disclosed technology.

Referring to FIG. 10, when an object is detected while both the first unit pixel 1110 and the second unit pixel 1120 are in an ON state, the timing controller may maintain the 0th transfer transistor in an deactivated state (OFF) such that the second unit pixel 1120 is in an OFF state, sequentially activate the second transfer transistor TX2, the third transfer transistor TX3, and the fourth transfer transistor TX4, and sequentially activate the first select transistor SX1 and the first reset transistor RX1 so that the first unit pixel 1110 is in an ON state.

In the full mode state (the 0th transfer transistor TX0 is in an deactivated state (OFF) and the first transfer transistor TX1 is activated), when a processor (not illustrated) analyzes image data and an object (e.g., person) is detected, as the 0th transfer transistor TX0 maintains its deactivated state (OFF) based on the control signal of the timing controller 1700, the second unit pixel 1120, which includes pixels larger than the pixels in the first unit pixel 1110, transitions to an OFF state. As the second transfer transistor TX2, the third transfer transistor TX3, and the fourth transfer transistor TX4 are sequentially activated, and the first select transistor SX1, which is a common line, and the first reset transistor RX1 are sequentially activated, the first unit pixel 1110, which includes pixels smaller than the pixels in the second unit pixel 1120, transitions to an ON state. In this way, as the pixels capturing an image of an object (e.g., person) are in an ON state and the pixels capturing background images around the object are in an OFF state. Because the object is focused and the background is blurred, it is possible to reduce the memory usage and power consumption compared to the full mode.

Figure 11:
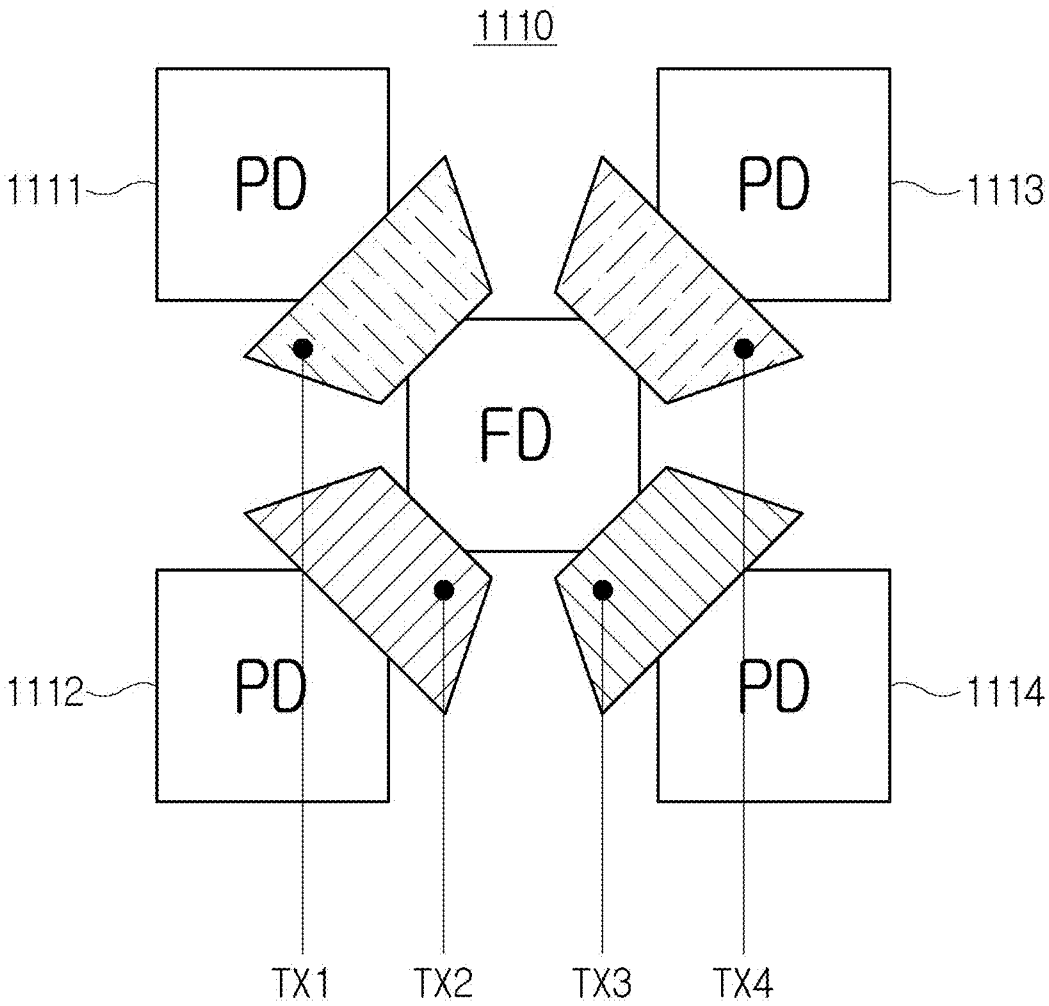
FIG. 11 shows an example of a pixel array 1100 based on an embodiment of the disclosed technology.
Figure 12:
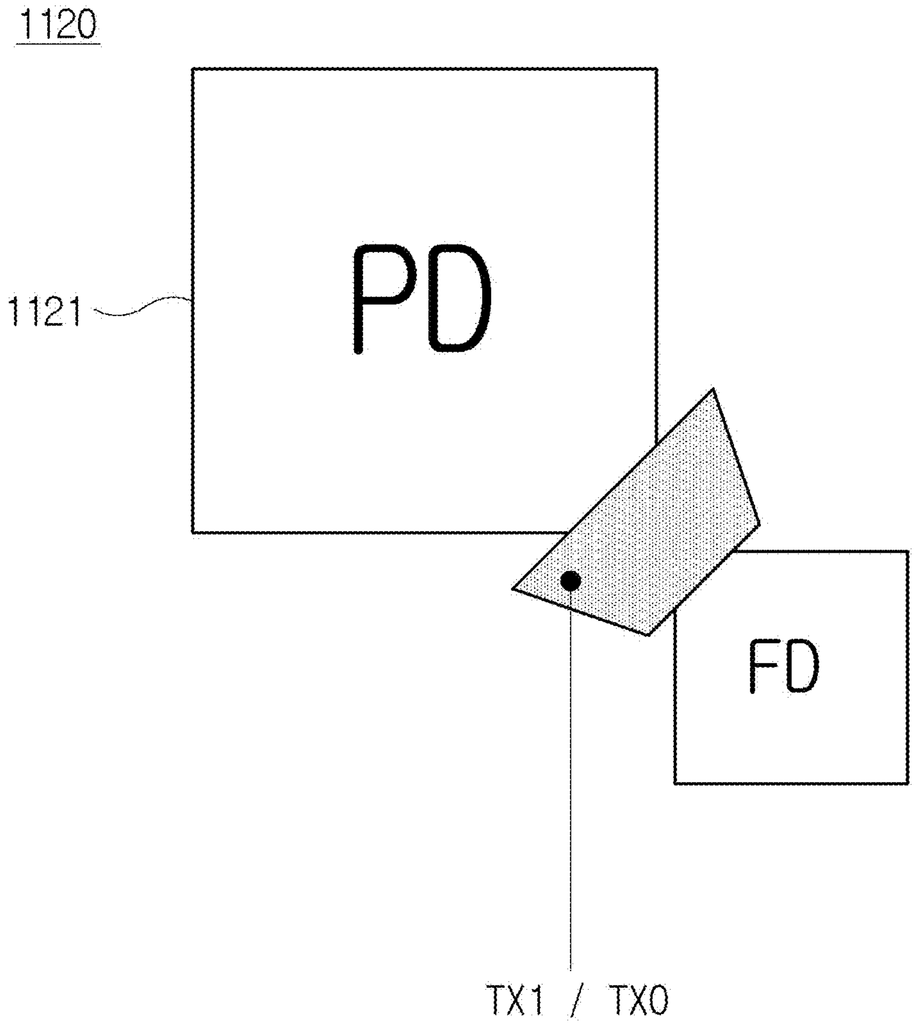
FIG. 12 shows another example of a pixel array 1100 based on an embodiment of the disclosed technology.

FIGS. 11 and 12 show examples of a pixel array 1100 based on some embodiments of the disclosed technology.

Referring to FIG. 11, as an example, the first unit pixel 1110 includes four photodiodes PD, and different photodiodes 1111, 1112, 1113, 1114 may be electrically connected to different transfer transistors TX1, TX2, TX3, TX4, respectively. In some implementations, the transfer transistors TX1, TX2, TX3, TX4 are turned on in response to different transfer transistor control signals, respectively. In some implementations, the transfer transistors TX1, TX2, TX3, TX4 may be switching devices that are not transistors.

In an example configuration where the first unit pixel 1110 includes the first photodiode 1111, the second photodiode 1112, the third photodiode 1113, and the fourth photodiode 1114.

As an example, the first photodiode 1111 may be electrically connected to the first transfer transistor TX1, the second photodiode 1112 may be electrically connected to the second transfer transistor TX2, the third photodiode 1113 may be electrically connected to the third transfer transistor TX3, and the fourth photodiode 1114 may be electrically connected to the fourth transfer transistor TX4.

Each of the first photodiode 1111, the second photodiode 1112, the third photodiode 1113, and the fourth photodiode 1114 may be electrically connected to the floating diffusion region FD.

As an example, the first unit pixel 1110 may include the first transfer transistor TX1, the second transfer transistor TX2, the third transfer transistor TX3, and the fourth transfer transistor TX4.

The first transfer transistor TX1 may transfer photocharges generated by the first photodiode 1111 to the floating diffusion region FD.

The second transfer transistor TX2 may transfer photocharges generated by the second photodiode 1112 to the floating diffusion region FD.

The third transfer transistor TX3 may transfer photocharges generated by the third photodiode 1113 to the floating diffusion region FD.

The fourth transfer transistor TX4 may transfer photocharges generated by the fourth photodiode 1114 to the floating diffusion region FD.

Referring to FIG. 12, as an example, the second unit pixel 1120 includes a single photodiode 1121, and the photodiode 1121 of the second unit pixel 1120 may be electrically connected to the 0th transfer transistor TX0 or the first transfer transistor TX1.

As an example, each area of the first photodiode 1111, the second photodiode 1112, the third photodiode 1113, and the fourth photodiode 1114 of the first unit pixel 1110 may be about ¼ of an area of the photodiode 1121 of the second unit pixel 1120.

When the photodiode PD of the second unit pixel 1120 is electrically connected to the first transfer transistor TX1, the timing diagram and the operation in the full mode or small mode (small pixel full mode) are the same as the timing diagram and the operation of the embodiments described above.

When the photodiode PD of the second unit pixel 1120 is electrically connected to the 0th transfer transistor TX0, the timing diagram and the operation in the full mode or small mode (small pixel full mode) are the same as the timing diagram and the operation of the embodiments described above.

Figure 13:
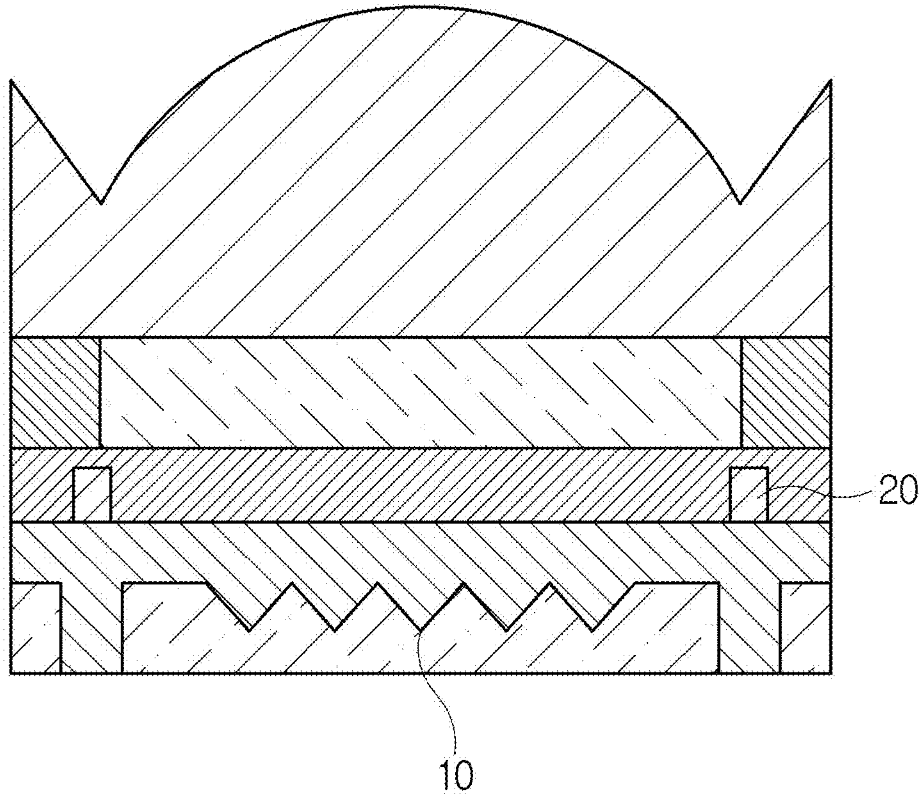
FIG. 13 shows an example structure of an image sensing device based on an embodiment of the disclosed technology.

FIG. 13 shows an example structure of an image sensing device based on an embodiment of the disclosed technology.

Referring to FIG. 13, the first unit pixel 1110 or the second unit pixel 1120 may include a sawtooth-shaped (or triangular) concavo-convex structure 10 formed on a substrate.

The first unit pixel 1110 or the second unit pixel 1120 forms the sawtooth-shaped (or triangular) concave-convex structure 10 on the substrate, so that the incident light is scattered and the incident distance becomes longer and the staying time in the substrate (Si) increases, which has an effect of increasing quantum efficiency (QE).

In the case of the first unit pixel 1110, which is a small pixel, it is disadvantageous to receive a lot of light compared to the second unit pixel 1120, which is a big pixel, thus quantum efficiency (QE) can be increased by forming the sawtooth-shaped (or triangular) concave-convex structure 10 on the substrate.

Figure 14:
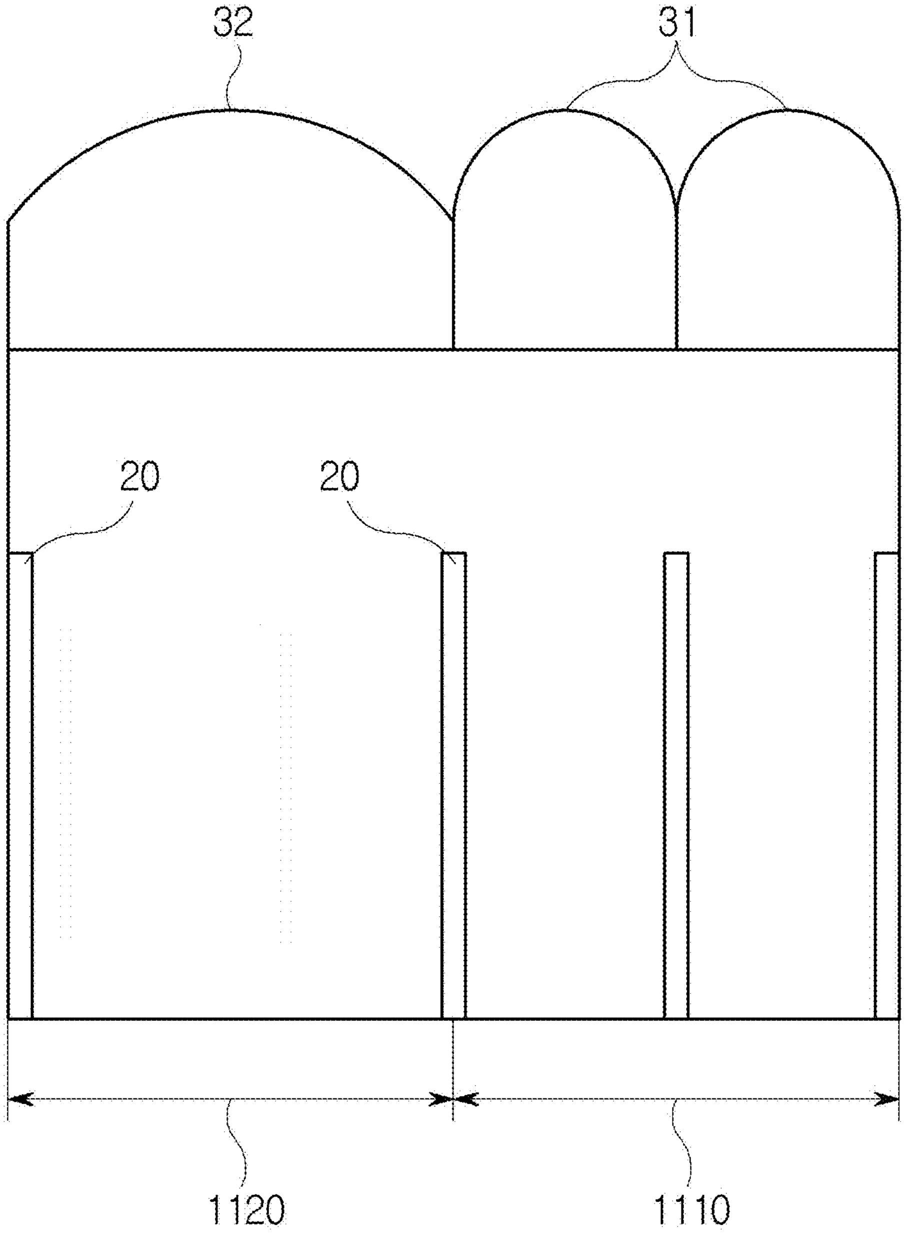
FIG. 14 shows another example structure of an image sensing device based on an embodiment of the disclosed technology.

FIG. 14 shows an example structure of an image sensing device based on an embodiment of the disclosed technology.

Referring to FIG. 14, the image sensing device may include a deep trench isolation layer (DTI) 20 that optically separates the first unit pixel 1110 and the second unit pixel 1120 from each other. The deep trench isolation layer 20 may include an insulating material.

The deep trench isolation layer 20 may be formed between the first unit pixel 1110 and the second unit pixel 1120 and between regions including each photodiode of the first unit pixel 1110.

The first unit pixel 1110 may include a plurality of first microlenses 31 formed at a top.

The second unit pixel 1120 may include a single second microlens 32 formed at the top.

A width of the second microlens 32 of the second unit pixel 1120 may be greater than a width of the first microlens 31 of the first unit pixel.

In some implementations, the deep trench isolation layer 20 may be formed between the first unit pixel 1110, which is a small pixel, and the second unit pixel 1120, which is larger than the first unit pixel 1110, and between the first unit pixel 1110 and the first unit pixel 1110, the deep trench isolation layer 20 may have various depths (deep or shallow).

Figure 15:
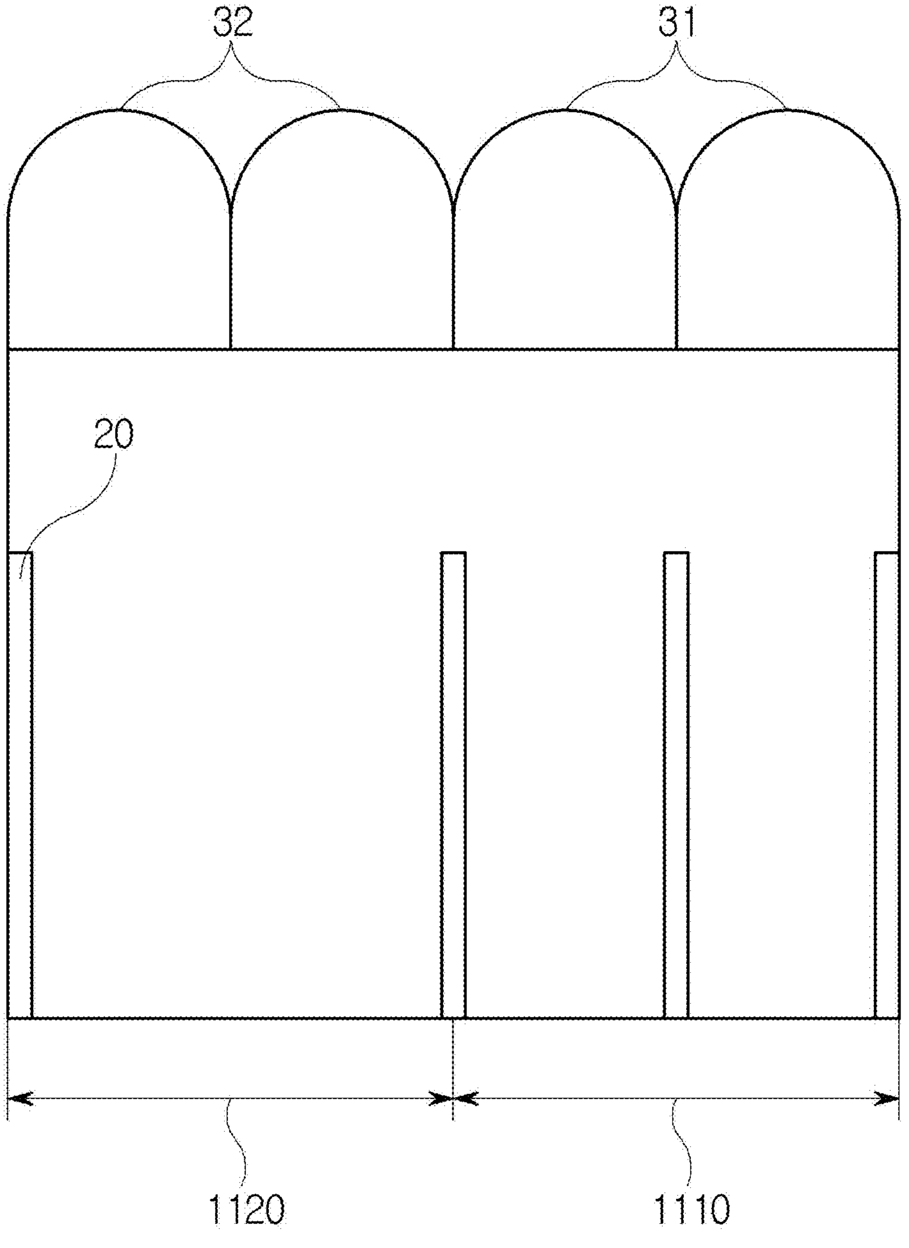
FIG. 15 shows another example structure of an image sensing device based on an embodiment of the disclosed technology.

FIG. 15 shows an example structure of an image sensing device based on an embodiment of the disclosed technology.

Referring to FIG. 15, the image sensing device may include the first microlens 31 formed at the top of the first unit pixel 1110 and the second microlens 32 formed at the top of the second unit pixel 1120.

As an example, the first microlens 31 and the second microlens 32 may have the same width.

Figure 16:
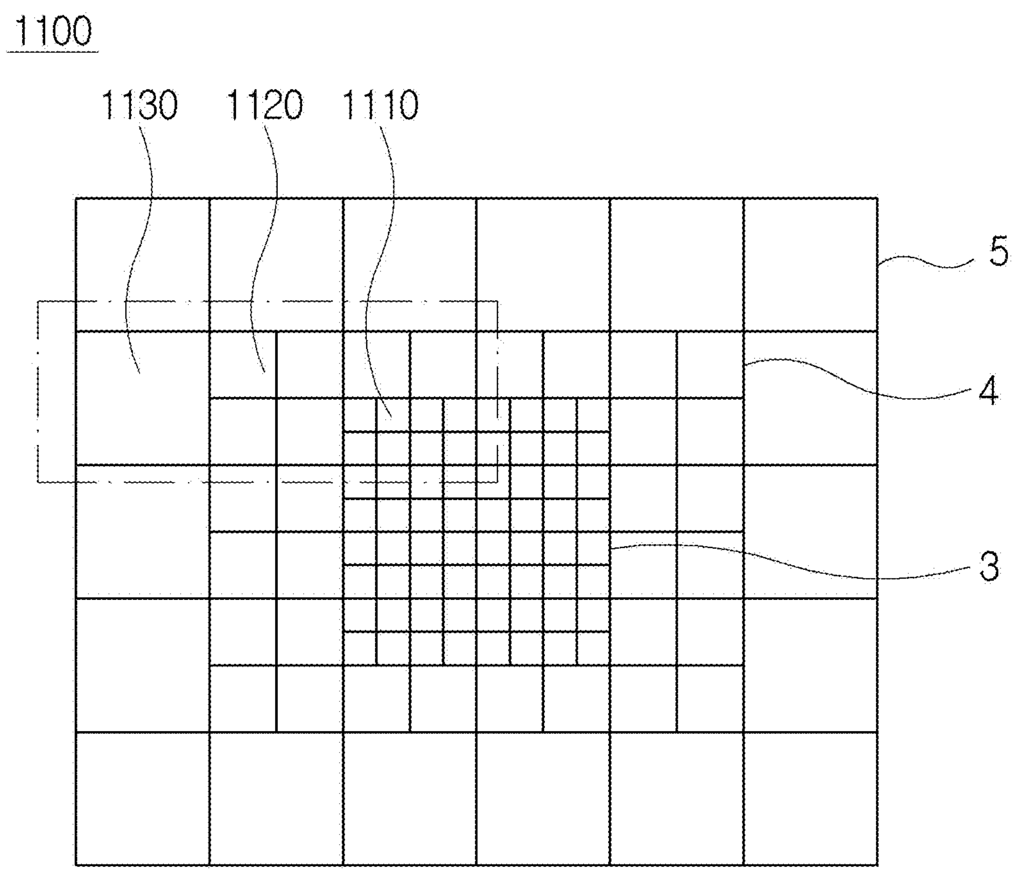
FIG. 16 shows an example of a pixel array 1100 based on an embodiment of the disclosed technology.

FIG. 16 shows an example of a pixel array 1100 based on an embodiment of the disclosed technology.

Referring to FIG. 16, the pixel array 1100 may include a first pixel array 3 (e.g., central pixel array) and a second pixel array surrounding the first pixel array.

As an example, the first pixel array 3 is a small pixel region disposed in a central region of the pixel array 1100 and may include a plurality of first unit pixels 1110.

The second pixel array may include a first peripheral pixel array 4 and a second peripheral pixel array 5.

As an example, the first peripheral pixel array 4 is a middle pixel region disposed to surround the central pixel array 3 and may include a plurality of second unit pixels 1120.

As an example, the second peripheral pixel array 5 is a big pixel region disposed to surround the first peripheral pixel array 4 and may include a plurality of third unit pixels 1130.

As an example, the first unit pixel 1110 may include a plurality of photodiodes.

As an example, the second unit pixel 1120 may include a plurality of photodiodes or a single photodiode.

As an example, the third unit pixel 1130 may include a plurality of photodiodes or a single photodiode.

When an object is detected based on a control signal of the timing controller 1700, by moving the camera to or focusing the camera on the object, and then operating only the first unit pixel 1110 of the central pixel array 3 and/or the second unit pixel 1120 of the first peripheral pixel array 4 randomly selected, the memory usage and power consumption can be reduced.

The number of photodiodes, a transfer transistor, a reset transistor, and a select transistor electrically connected to the photodiode of the first unit pixel 1110 and the second unit pixel 1120, and operation details thereof may be the same as the number of photodiodes, the transfer transistor, the reset transistor, and the select transistor electrically connected to the photodiode of the first unit pixel 1110 and the second unit pixel 1120 described above.

Figure 17:
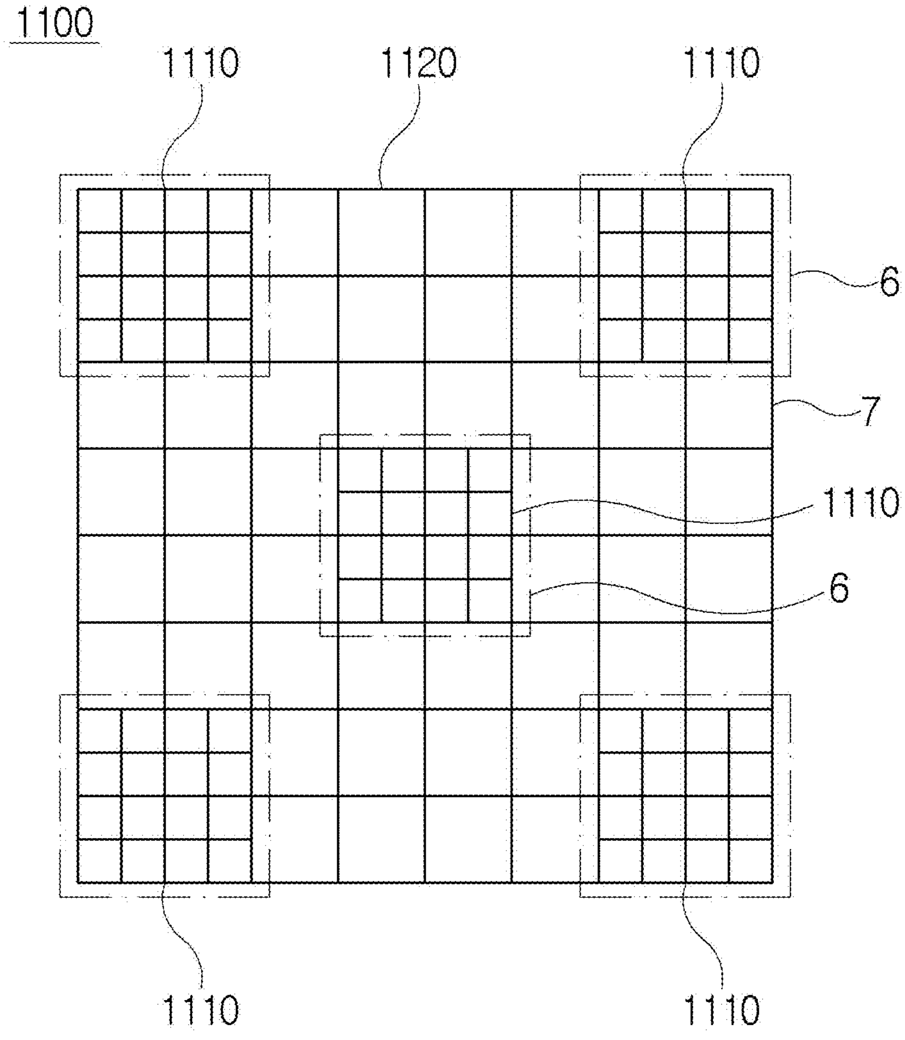
FIG. 17 shows an example of a pixel array 1100 based on an embodiment of the disclosed technology.

FIG. 17 shows an example of a pixel array 1100 based on an embodiment of the disclosed technology.

Referring to FIG. 17, the pixel array 1100 may include a first pixel array 6 and a second pixel array 7.

As an example, the first pixel array 6 is a small pixel region formed in a central region and a corner region, and may include a plurality of first unit pixels 1110.

As an example, the second pixel array 7 is a big pixel region formed in a region other than the central region and the corner region, and may include a plurality of second unit pixels 1120.

As an example, the first unit pixel 1110 may include a plurality of photodiodes.

As an example, the second unit pixel 1120 may include a plurality of photodiodes or a single photodiode.

When an object is detected based on a control signal of the timing controller 1700, by moving the camera to or focusing the camera on the object, and then operating only the first unit pixel 1110 of the first pixel array 6 randomly selected, the memory usage and power consumption can be reduced.

The number of photodiodes, a transfer transistor, a reset transistor, and a select transistor electrically connected to the photodiode of the first unit pixel 1110 and the second unit pixel 1120, and operation details thereof may be the same as the number of photodiodes, the transfer transistor, the reset transistor, and the select transistor electrically connected to the photodiode of the first unit pixel 1110 and the second unit pixel 1120 described above.

Figure 18:
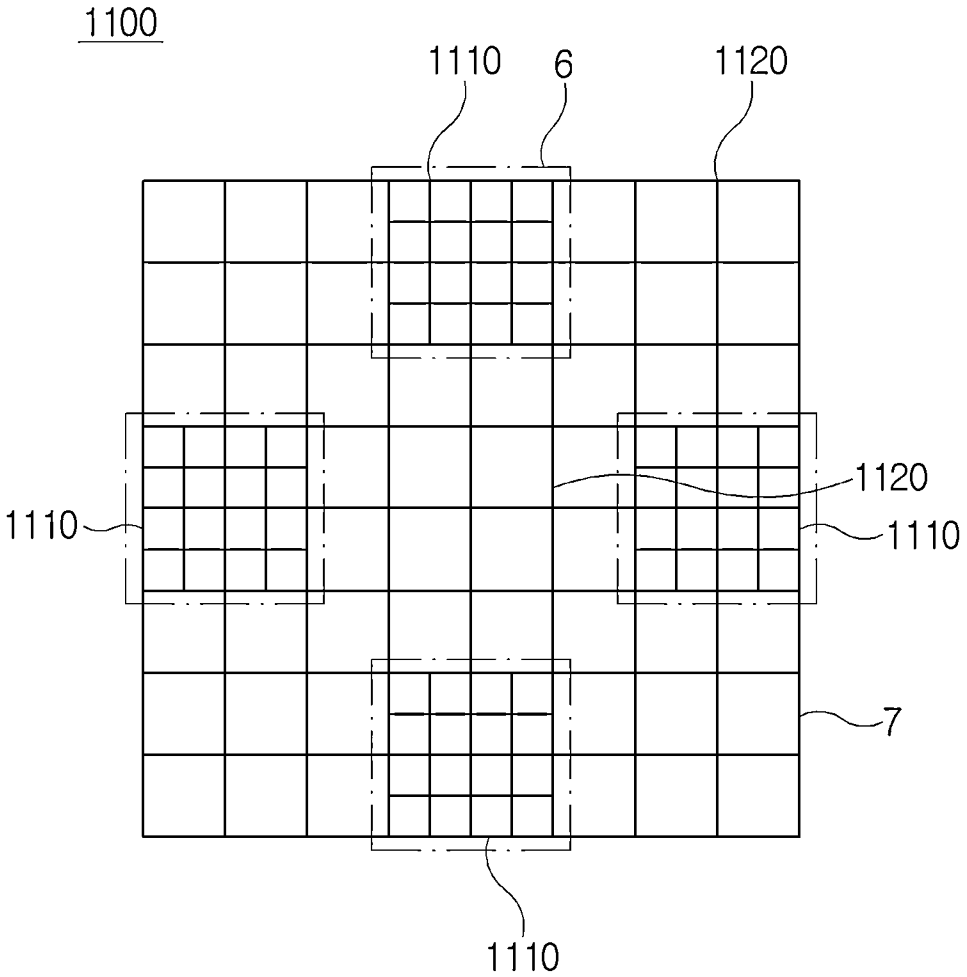
FIG. 18 shows an example of a pixel array 1100 based on an embodiment of the disclosed technology.

FIG. 18 shows an example of a pixel array 1100 based on an embodiment of the disclosed technology.

Referring to FIG. 18, the pixel array 1100 may include a first pixel array 6 and a second pixel array 7.

As an example, the first pixel array 6 is a small pixel region formed in a region other than the central region and the corner region, and may include a plurality of first unit pixels 1110.

As an example, the second pixel array 7 is a big pixel region disposed to surround the central region and the corner region, and may include a plurality of second unit pixels 1120.

The second unit pixel 1120 may include a plurality of photodiodes or a single photodiode.

When an object is detected based on a control signal of the timing controller 1700, by moving the camera to or focusing the camera on the object, and then operating only the first unit pixel 1110 of the first pixel array randomly selected, the memory usage and power consumption can be reduced.

The number of photodiodes, a transfer transistor, a reset transistor, and a select transistor electrically connected to the photodiode of the first unit pixel 1110 and the second unit pixel 1120, and operation details thereof may be the same as the number of photodiodes, the transfer transistor, the reset transistor, and the select transistor electrically connected to the photodiode of the first unit pixel 1110 and the second unit pixel 1120 described above.

Figure 19:
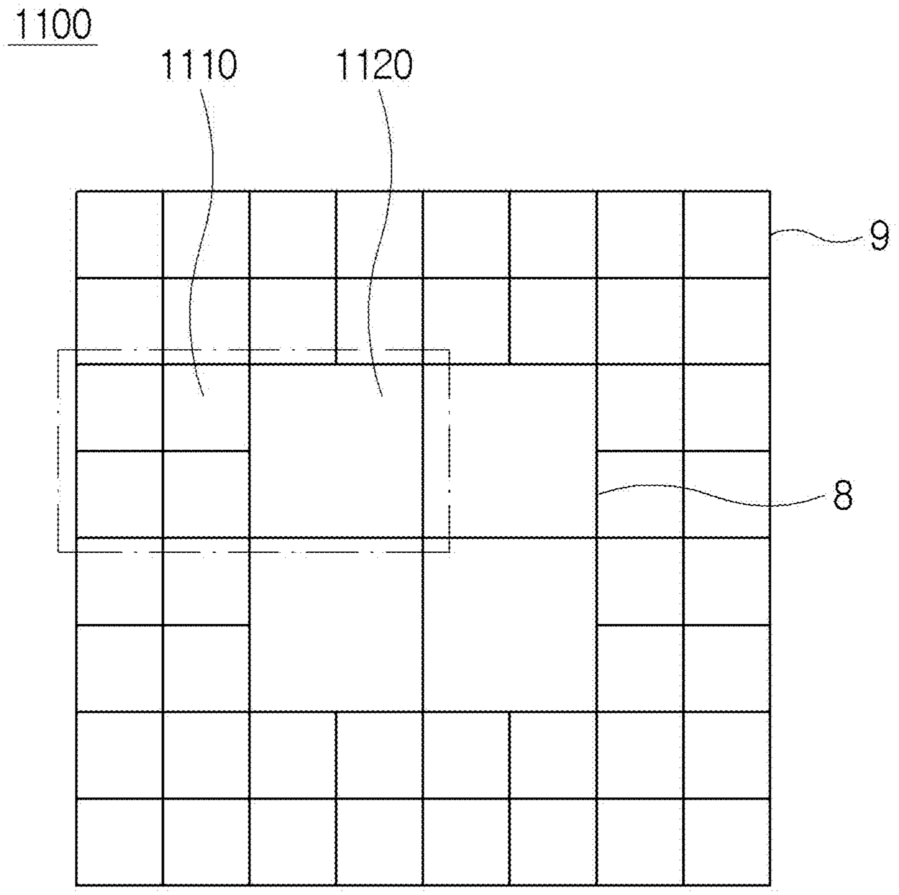
FIG. 19 shows an example of a pixel array 1100 based on an embodiment of the disclosed technology.

FIG. 19 shows an example of a pixel array 1100 based on an embodiment of the disclosed technology.

Referring to FIG. 19, a pixel array 1100 based on an embodiment of the disclosed technology may include a central pixel array 8 and a peripheral pixel array 9.

As an example, the central pixel array 8 is a big pixel region disposed in a central region of the pixel array 1100 and may include a plurality of second unit pixels 1120.

As an example, the peripheral pixel array 9 is a small pixel region disposed to surround the central pixel array 8 and may include a plurality of first unit pixels 1110.

When an object is detected based on a control signal of the timing controller 1700, by moving the camera to or focusing the camera on the object and then operating only the first unit pixel 1110 of the peripheral pixel array randomly selected, the memory usage and power consumption can be reduced. In addition, it is advantageous for post-processing since a high-resolution image for the background can be output through the peripheral pixel array 9, which is a small pixel region. For example, it is easy to remove images associated with unnecessary objects from the background through a high-resolution background image, and it is possible to remove images from abnormal pixels and use adjacent pixel data of the peripheral pixel array 9.

While this patent document contains many specifics, these should not be construed as limitations on the scope of any subject matter or of what may be claimed, but rather as descriptions of features that may be specific to particular embodiments of particular techniques. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Only a few implementations and examples are described and other implementations, enhancements and variations can be made based on what is described and illustrated in this patent document.

What is claimed is:

1. An image sensing device, comprising:

a plurality of pixel arrays, wherein the pixel arrays comprise:

a first pixel array comprising a plurality of first unit pixels and a second pixel array disposed to surround the first pixel array and comprising a plurality of second unit pixels, wherein the first unit pixel comprises a plurality of photodiodes, and each photodiode of the first unit pixel is connected to a different transfer transistor, wherein the second unit pixel comprises a plurality of photodiodes, and the plurality of photodiodes of the second unit pixel is connected to a single transfer transistor.

2. The image sensing device of claim 1, wherein the plurality of photodiodes of the first unit pixel comprises a first photodiode, a second photodiode, a third photodiode, and a fourth photodiode, and wherein the first photodiode is connected to a first transfer transistor, the second photodiode is connected to a second transfer transistor, the third photodiode is connected to a third transfer transistor, and the fourth photodiode is connected to a fourth transfer transistor.

3. The image sensing device of claim 2, further comprising:

a timing controller configured to control operations of the first transfer transistor, the second transfer transistor, the third transfer transistor, and the fourth transfer transistor, wherein the first unit pixel comprises a first select transistor, and the second unit pixel comprises a second select transistor, and wherein, in a full mode, the timing controller activates the first transfer transistor, the second transfer transistor, the third transfer transistor, and the fourth transfer transistor and turns on the first select transistor and the second select transistor so that both the first unit pixel and the second unit pixel are in an activated state.

4. The image sensing device of claim 3, wherein the first unit pixel comprises a first reset transistor, and the second unit pixel comprises a second reset transistor, and wherein the timing controller activate the first reset transistor so that the second unit pixel is in a deactivated state, when an object is detected while both the first unit pixel and the second unit pixel are in an activated state;

wherein the timing controller sequentially turns on the second transfer transistor, the third transfer transistor, and the fourth transfer transistor, and sequentially turns on the second select transistor and the second reset transistor so that the first unit pixel is in an activated state.

5. The image sensing device of claim 1, wherein the single transfer transistor is a zeroth transfer transistor.

6. The image sensing device of claim 5, wherein the first unit pixel comprises a first photodiode, a second photodiode, a third photodiode, and a fourth photodiode, and wherein the first photodiode is connected to a first transfer transistor, the second photodiode is connected to a second transfer transistor, the third photodiode is connected to a third transfer transistor, and the fourth photodiode is connected to a fourth transfer transistor.

7. The image sensing device of claim 6, further comprising:

a timing controller configured to activate the zeroth transfer transistor, the first transfer transistor, the second transfer transistor, the third transfer transistor, and the fourth transfer transistor, wherein the first unit pixel and the second unit pixel comprise a first select transistor, and wherein, in a full mode, the timing controller activates the zeroth transfer transistor, the first transfer transistor, the second transfer transistor, the third transfer transistor, and the fourth transfer transistor and turns on the first select transistor so that both the first unit pixel and the second unit pixel are in an activated state.

8. The image sensing device of claim 7, wherein the first unit pixel and the second unit pixel comprise a first reset transistor, and wherein the timing controller, when an object is detected while both the first unit pixel and the second unit pixel are in an activated state, maintains the zeroth transfer transistor in a deactivated state so that the second unit pixel is in a deactivated state; sequentially activates the second transfer transistor, the third transfer transistor, and the fourth transfer transistor and sequentially turns on the first select transistor and the first reset transistor so that the first unit pixel is in an activated state.

9. The image sensing device of claim 1, wherein the first unit pixel or the second unit pixel comprises a sawtooth-shaped concavo-convex structure formed on a substrate.

10. The image sensing device of claim 2, comprising:

a deep trench isolation layer configured to optically separate the first unit pixel from the second unit pixel, and wherein the deep trench isolation layer is formed between the first unit pixel and the second unit pixel and between regions comprising each photodiode of the first unit pixel.

11. The image sensing device of claim 2, wherein each of the first unit pixel and the second unit pixel comprises a plurality of microlenses formed at a top region of the first unit pixel and the second unit pixel, and wherein a microlens of the first unit pixel has a same width as a microlens of the second unit pixel.

12. The image sensing device of claim 1, wherein the first unit pixel comprises a plurality of microlenses formed at a top region of the first unit pixel, and the second unit pixel comprises a single microlens formed at a top region of the second unit pixel, and wherein a width of the microlens of the second unit pixel is greater than a width of the microlens of the first unit pixel.

13. The image sensing device of claim 1, wherein the second pixel array comprises:

a first peripheral pixel array disposed to surround the first pixel array and comprising a plurality of second unit pixels; and a second peripheral pixel array disposed to surround the first peripheral pixel array and comprising a plurality of third unit pixels.

14. The image sensing device of claim 13, each of the plurality of third unit pixels comprises a plurality of photodiodes or a single photodiode.

15. An image sensing device, comprising:

a plurality of pixel arrays, wherein the pixel arrays comprise:

a first pixel array formed in a central region and a corner region and comprising a plurality of first unit pixels; and a second pixel array formed in a region other than the central region and the corner region and comprising a plurality of second unit pixels, wherein the first unit pixel comprises a plurality of photodiodes, wherein an area of the first pixel array is smaller than an area of the second pixel array, wherein the second unit pixel comprises a plurality of photodiodes, and the plurality of photodiodes of the second unit pixel is connected to a single transfer transistor.

16. An image sensing device, comprising:

a plurality of pixel arrays, wherein the pixel arrays comprise:

a first pixel array formed in a region other than a central region and a corner region and comprising a plurality of first unit pixels, and a second pixel array formed in the central region and the corner region and comprising a plurality of second unit pixels, wherein the first unit pixel comprises a plurality of photodiodes, wherein an area of the first pixel array is smaller than an area of the second pixel array, wherein the second unit pixel comprises a plurality of photodiodes, and the plurality of photodiodes of the second unit pixel is connected to a single transfer transistor.

* * * * *